US006707118B2

(12) United States Patent
Muljono et al.

(10) Patent No.: US 6,707,118 B2
(45) Date of Patent: Mar. 16, 2004

(54) SEMICONDUCTOR-ON-INSULATOR RESISTOR-CAPACITOR CIRCUIT

(75) Inventors: Harry Muljono, Union City, CA (US); Stefan Rusu, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/298,756

(22) Filed: Nov. 18, 2002

(65) Prior Publication Data

US 2003/0067044 A1 Apr. 10, 2003

Related U.S. Application Data

(62) Division of application No. 09/540,117, filed on Mar. 31, 2000.

(51) Int. Cl.[7] .......................... H01L 29/94; H01L 29/76

(52) U.S. Cl. ........................ 257/392; 257/347; 257/348

(58) Field of Search ................................ 257/392, 347, 257/348

(56) References Cited

U.S. PATENT DOCUMENTS 6,060,364 A * 5/2000 Maszara et al. ............ 438/305
6,310,377 B1 * 10/2001 Maeda et al. ............... 257/347

* cited by examiner

*Primary Examiner*—Amir Zarabian
*Assistant Examiner*—Kiesha Rose
(74) *Attorney, Agent, or Firm*—Trop, Pruner & Hu, P.C.

(57) ABSTRACT

A semiconductor device may be formed with a floating body positioned over an insulator in a semiconductor structure. A gate may be formed over the floating body but spaced therefrom. The semiconductor structure may include doped regions surrounding the floating body The floating body provides a distributed capacitance and resistance along its length to form an integrated RC circuit. The extent of the resistance is a function of the cross-sectional area of the floating body along the source and drain regions and its capacitance is a function of the spacing between the doped regions and the body and between the gate and the body. In some embodiments of the present invention, compensation for input voltage variations may be achieved.

8 Claims, 4 Drawing Sheets

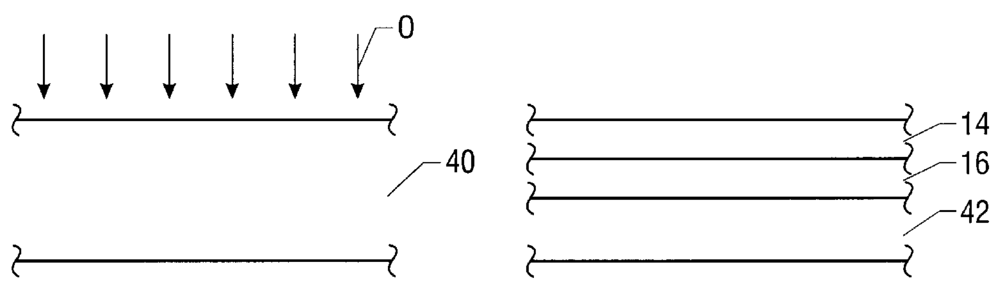
FIG. 8A
FIG. 8B
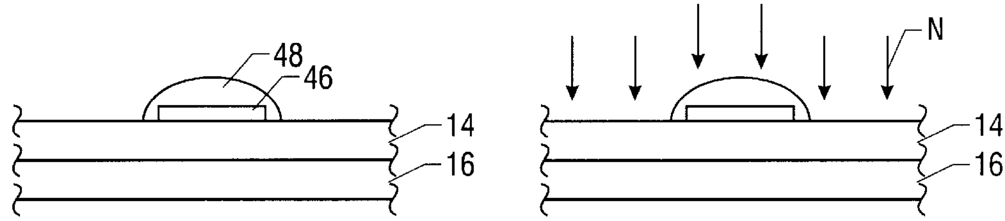
FIG. 8C
FIG. 8D
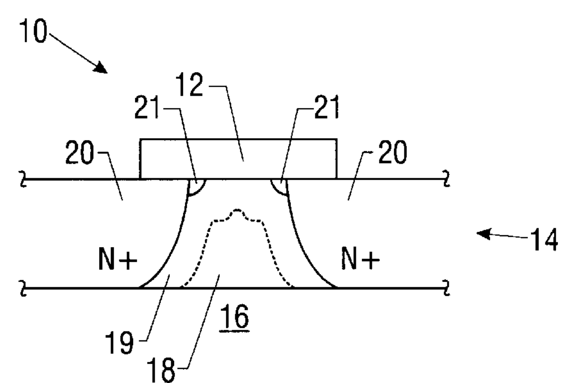
FIG. 8E

SEMICONDUCTOR-ON-INSULATOR RESISTOR-CAPACITOR CIRCUIT

This is a divisional of prior U.S. application Ser. No. 09/540,117, filed Mar. 31, 2000.

BACKGROUND

This invention relates generally to a resistor capacitor circuit.

Resistor-capacitor (RC) circuits may be utilized to form RC filters. Conventionally, an integrated RC circuit is constructed as a dedicated N-well resistor coupled to a transistor. Capacitance is provided by the transistor's gate to substrate capacitance. The transistor may be formed in a P-type substrate having two N-type doped regions on either side of a gate situated over the substrate. A separate resistor is formed in an N-well in the same substrate. A pair of doped regions are defined in the N-well to act as the low resistance contacts of the resistor. The region between the doped regions provides the resistance. One of the resistor's doped regions in the N-well is coupled to one of the capacitor's doped regions in the P-type substrate.

The N-well length and the gate area may be properly sized to achieve the desired filter cut off frequency. While such circuits may work well, they use a significant amount of chip area. Thus, a relatively large amount of the silicon substrate may be taken up by these relatively simple circuits.

The conventional integrated RC circuits may also experience one or more of the following drawbacks. A metal interconnection is used between the capacitor and the resistor. This also takes additional room and adds fabrication complexity. Moreover, the capacitance and the resistance created by such a structure is lumped or concentrated at one location. Also, the RC product changes in response to input voltage changes. An increase or decrease in the input voltage changes the RC product.

Thus, there is a need for better ways to implement integrated RC circuits.

BRIEF DESCRIPTION OF THE DRAWINGS

FIGS. 8A–8D are a series of partial, enlarged cross-sectional views of a process for making an embodiment of the present invention; and FIG. 8E is a partial, further enlarged cross-sectional view of the completed device.

DETAILED DESCRIPTION

Figure 1:
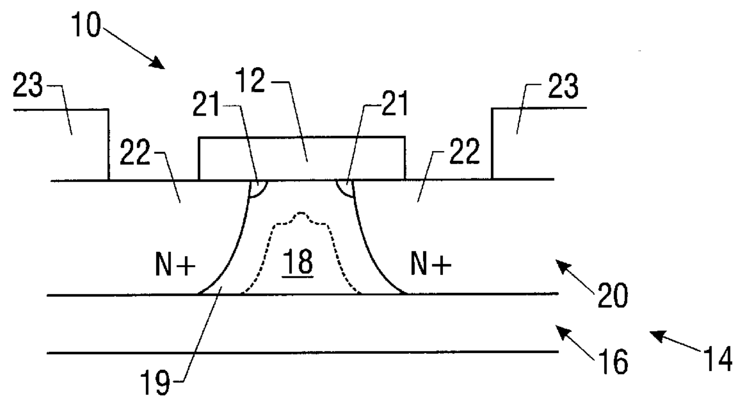
FIG. 1 is an enlarged cross-sectional view of one embodiment of the present invention.

A resistor-capacitor (RC) circuit 10, shown in FIG. 1, includes a gate 12 formed on top of a semiconductor structure 14. The semiconductor structure 14 includes a semiconductor layer 20 formed over an insulation layer 16. Conventionally, the structure 14 may be called a semiconductor-on-insulator or silicon-on-insulator device. Silicon-on-insulator (SOI) technology utilizes a semiconductor structure overlying an insulation layer formed on a supporting bulk wafer.

An SOI structure may be formed by a number of well known techniques such as separation by implanted oxygen (SIMOX), zone melting and recrystalization (AMR) or bonded and etchback (BESOI) as examples. Typically, the SOI structure includes a silicon layer formed on a layer of silicon oxide buried in a silicon structure. The layer of oxide may help to reduce the drain-to-substrate and source-to-substrate capacitance in some implementations.

A floating body 18 (shown by dashed lines) is defined in the semiconductor layer 20. When the semiconductor layer 22 is an N-type material, the floating body 18 is formed of a P-type material and may be referred to as a P-type floating body.

The body 18 may be separated from the gate 12 and the top of the structure 14 by a depletion region 19 in one embodiment of the invention. To either side of the body 18 and spaced therefrom are N-type heavily doped regions 20. The heavily doped regions 20 may form the source and drain of a field effect transistor whose gate is the gate 12. The heavily doped regions 20 together with lightly doped regions 21 may form a lightly doped drain (LDD) field effect transistor in one embodiment of the invention. The regions 20 are contacted by the contacts 23.

Figure 2:
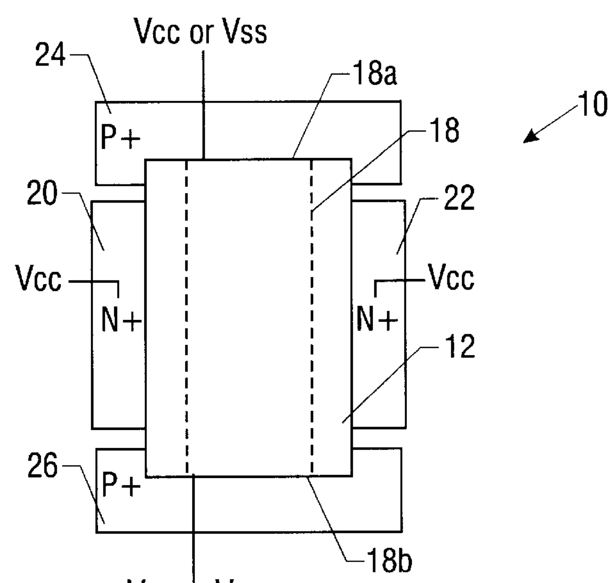
FIG. 2 is an enlarged top plan view of the embodiment shown in FIG. 1.

Turning to FIG. 2, the heavily doped regions 20 are arranged to either side of the body 18 (shown in dotted lines in FIG. 2). Thus, the heavily doped regions 20 are adjacent to but are spaced from the side edges of the floating body 18. The lightly doped N-type regions 21 extend under the gate 12 and over the depletion region 19. The body 18 is completely isolated, on one side by the insulation layer 16 and on the other side by the intervening lightly doped N-type regions 21.

A pair of spaced apart doped regions 24 and 26 are aligned along the end portions 18*a* and 18*b* of the floating body 18. The regions 24 and 26 may be P-type bodies which make electrical connection to the floating body 18 and allow an electrical contact to be formed. The regions 24 and 26 may be contacted to provide the input and output signal nodes of the RC circuit 10.

Thus, the length of the floating body 18 between the regions 24 and 26 acts as a distributed resistance having a resistance value that is a function of its length and width. At the same time, distributed capacitance is formed along the length of the floating body 18 between the regions 24 and 26. In particular, capacitance arises between the body 18 and the heavily doped regions 20. Additional capacitance arises between the floating body 18 and the gate 12. This capacitance is distributed in the sense that it is a function of the length of the floating body 18. Both the resistance and the capacitance created by the body 18 are distributed in that they are distributed along the length of the body 18 between the regions 24 and 26.

Figure 3:
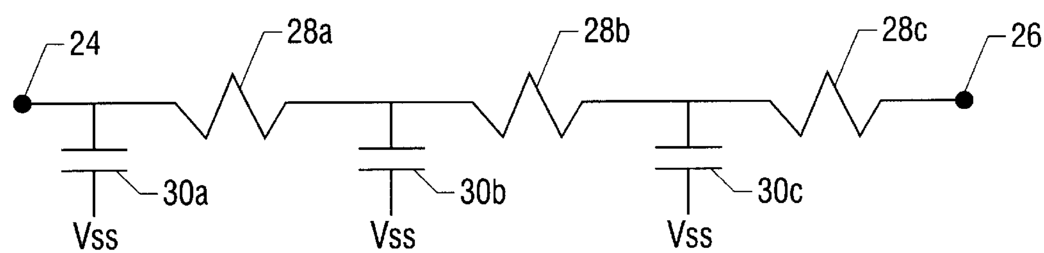
FIG. 3 is a circuit diagram for the embodiment depicted in FIGS. 1 and 2.

Referring to FIG. 3, the nodes 24 and 26 represent the regions 24 and 26. The distributed capacitance 30*a*, 30*b* and 30*c* is created along the length of the floating body 18 between the body 18 and the heavily doped regions 22 and between the body 18 and the gate 12. In addition, along the length of the body 18 is distributed resistance 28*a*, 28*b* and 28*c*. The potential $V_{ss}$ is applied to one node of each capacitor 30.

Figure 4:
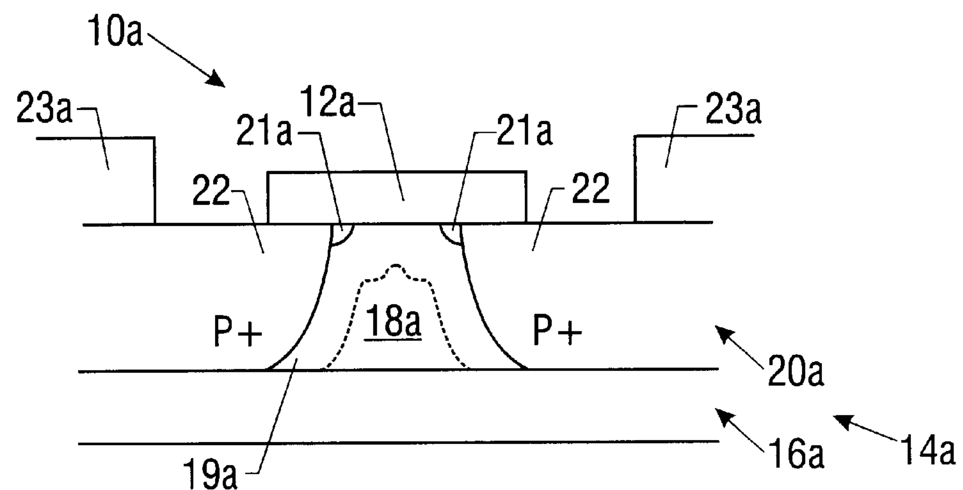
FIG. 4 is an enlarged cross-sectional view of another embodiment of the present invention.
Figure 5:
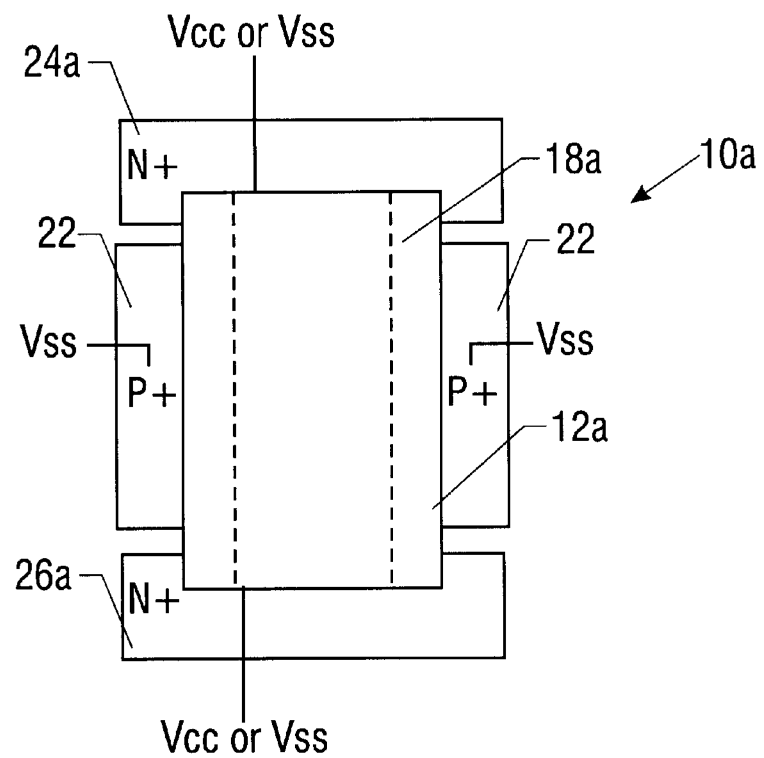
FIG. 5 is an enlarged top plan view of the embodiment shown in FIG. 4.

The floating body 18*a* shown in FIGS. 4 and 5 is N-type instead of P-type. The conductivity types of all of the other parts of the device 10*a* are inverted compared to the embodiment of FIGS. 1 and 2. In addition, instead of biasing the heavily doped regions 22 with the supply voltage $V_{cc}$, they are biased by a ground or low potential $V_{ss}$ as is conventional. Otherwise, the configuration of the N-type body embodiment of FIGS. 1 and 2 is the same as the P-type body embodiment of FIGS. 4 and 5.

Figure 6:
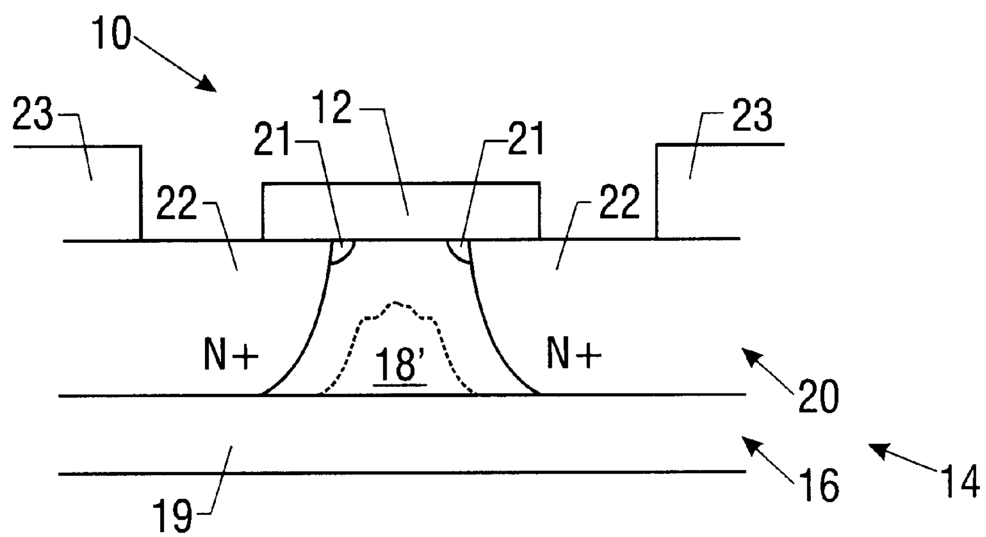
FIG. 6 is an enlarged cross-sectional view of the embodiment shown in FIG. 1 under the circumstances when the input voltage is low.

In some embodiments of the present invention, an RC circuit with self compensation can be created. In FIG. 6, the floating body 18' is relatively contracted due to a relatively lower input voltage (compared to a nominal value) applied to one of the regions 24 or 26. This results in a higher resistance value and a lower capacitance value. The lower capacitance value arises due to the increased depletion region. The higher resistance is due to the smaller cross-sectional area of the body 18' along its length. Thus, the lower input voltage is compensated by a higher resistance and lower capacitance. As a result, a more uniform RC product may be achieved even when the input voltage is lower than its nominal value.

Figure 7:
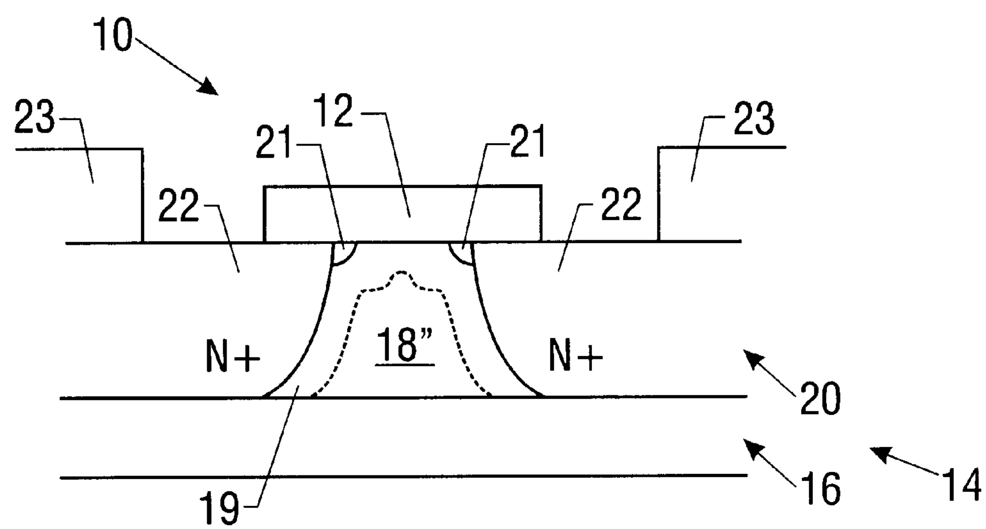
FIG. 7 is an enlarged cross-sectional view corresponding to FIG. 6 when the input voltage is high.

Similarly, with a higher input voltage, a lower resistance and a higher capacitance results as shown in FIG. 7. In this case, the body 18" is enlarged cross-sectionally increasing the capacitance between the body 18" and the heavily doped regions 20 and between the body 18" and gate 12 because of the reduced depletion region 19. At the same time, the increased cross-sectional size of the body 18" along its length results in a lower resistance value. Again, the effect is to compensate for the higher input voltage with the lower resistance and the higher capacitance. Thus, in each case the RC product may remain substantially unchanged.

With embodiments of the present invention, high speed analog circuits may use an RC circuit 10 such as an I/O impedance compensation or a phase locked loop circuit. The RC circuit 10 may consume less area, offer RC self compensation with respect to input voltage and may provide a distributed rather than a lumped resistance and capacitance. The need for extra metal interconnection between two independent devices forming the capacitance and the resistance is likewise eliminated in some embodiments of the present invention.

One exemplary process for forming the device 10, in accordance with one embodiment of the present invention, begins, as shown in FIG. 8A, with a semiconductor substrate 40 which may be a silicon substrate. The semiconductor substrate 40 is implanted with an oxygen implant as indicated by the arrows "O". A low dose oxygen implant creates a buried oxygen-doped region within the semiconductor substrate 40 which is spaced from the upper surface of the substrate. A buried oxide layer 16 may be formed by a high temperature anneal, for example at 1300° C. for several hours. The anneal oxidizes and repairs implant damage. The oxide layer 16, which may be on the order of 100 to 200 nanometers as one example, may be formed beneath an overlying semiconductor layer 14 and over an underlying semiconductor layer 42.

Thereafter, a gate structure 46 may be formed and covered with an oxide or other insulative layer 48 for purposes of forming a lightly doped drain transistor. The structure shown in FIG. 8C is then implanted, as indicated by the arrows N in FIG. 8D with an N-type conductivity determining impurity to create implanted regions masked by the layer 48. The implant and subsequent anneal forms heavily doped regions 20 to either side of the layer 48 and forms lightly doped regions 21 under the layer 48 in the semiconductor layer 14.

Thus, as shown in FIG. 8E, a body 18 may be defined between N-type heavily doped regions 20. In addition, the lightly doped regions 21 may be formed to extend from the heavily doped regions 20. A trench isolation (not shown) may be formed around the device 10.

The body 18 is floating because it is completely isolated. The body 18 floats between the underlying insulating layer 16, the heavily doped regions 20 and the overlying depletion region 19. The same process steps may be used to fabricate the device 10*a*.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A semiconductor device comprising:

a semiconductor structure including a semiconductor layer over an insulator layer; and a floating body formed in said semiconductor layer, said body having a pair of opposed end portions and a pair of opposed side portions, and an electrical connection to each of said end portions, said body forming an RC circuit whose resistance and capacitance self compensates for changes of an input voltage applied to said body through an electrical connection to one of said end portions.

2. The device of claim 1 including a field effect transistor formed in said semiconductor structure over said body, said transistor including a gate over said semiconductor layer, said doped region forming a source or drain of said transistor.

3. The device of claim 1 wherein said device is a silicon-on-insulator device.

4. The device of claim 1 including a doped region along at least one of said side portions, wherein said doped region is heavily doped and lightly doped regions extend under the gate.

5. The device of claim 2 wherein said transistor is in the form of a lightly doped drain field effect transistor.

6. The device of claim 5 wherein the source and drain of said transistor are arranged along the length of said body.

7. The device of claim 4 wherein said floating body has a flat side and follows the shape of the heavily doped and lightly doped regions.

8. The device of claim 7 wherein said flat side is formed on said insulator layer.

* * * * *